US012813080B2

(12) United States Patent
Lee et al.

(10) Patent No.: US 12,813,080 B2
(45) Date of Patent: Nov. 24, 2026

(54) DISPLAY PANEL AND DISPLAY DEVICE

(71) Applicant: LG Display Co., Ltd., Seoul (KR)

(72) Inventors: Seongjoo Lee, Paju-si (KR); SeungHee Nam, Paju-si (KR); JungSun Baek, Paju-si (KR); Yongmin Kim, Paju-si (KR); Seungpyo Hong, Pusan (KR); Yooji Hwang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 340 days.

(21) Appl. No.: 18/388,379

(22) Filed: Nov. 9, 2023

(65) Prior Publication Data

US 2024/0224601 A1 Jul. 4, 2024

(30) Foreign Application Priority Data

Dec. 29, 2022 (KR) ........................ 10-2022-0188459

(51) Int. Cl.
*H10K 59/122* (2023.01)
*H10K 59/80* (2023.01)

(52) U.S. Cl.
CPC ..... *H10K 59/122* (2023.02); *H10K 59/80515* (2023.02); *H10K 59/80518* (2023.02); *H10K 59/878* (2023.02)

(58) Field of Classification Search
CPC .. H10K 50/865; H10K 59/122; H10K 59/124; H10K 59/80515; H10K 59/80518; H10K 59/878
See application file for complete search history.

(56) References Cited

U.S. PATENT DOCUMENTS

| | | | | |
|---|---|---|---|---|
| 2018/0211979 | A1* | 7/2018 | Lee | H10K 59/38 |
| 2019/0189957 | A1* | 6/2019 | Gil | H10K 59/122 |
| 2020/0075699 | A1* | 3/2020 | Kim | H10K 59/80521 |
| 2020/0194509 | A1* | 6/2020 | Beak | H10K 59/80515 |
| 2020/0203447 | A1 | 6/2020 | Lee et al. | |
| 2021/0118962 | A1* | 4/2021 | Shin | H10K 59/50 |

FOREIGN PATENT DOCUMENTS

| | | | | |
|---|---|---|---|---|
| KR | 20150113422 A | * 10/2015 | | H10K 59/35 |
| KR | 10-2018-0087908 A | 8/2018 | | |
| KR | 10-2020-0025618 A | 3/2020 | | |
| KR | 10-2087103 B1 | 3/2020 | | |

* cited by examiner

*Primary Examiner* — Dmitriy Yemelyanov
(74) *Attorney, Agent, or Firm* — Birch, Stewart, Kolasch & Birch, LLP

(57) ABSTRACT

A subpixel for a display device can include a transistor disposed on a substrate; a first planarization layer disposed on the transistor, the first planarization layer including a concave portion that corresponds to an emission area of the subpixel; an anode electrode disposed in the concave portion of the first planarization layer, a light emitting layer disposed on the anode electrode; and a bank disposed on the anode electrode. Also, a portion of the bank is disposed in the concave portion of the first planarization layer in an area between a portion of light emitting layer and a portion of an inclined side surface of the anode electrode.

25 Claims, 10 Drawing Sheets

DISPLAY PANEL AND DISPLAY DEVICE

CROSS-REFERENCE TO RELATED APPLICATION

This application claims priority to Korean Patent Application No. 10-2022-0188459, filed in the Republic of Korea, on Dec. 29, 2022, the entirety of which is hereby incorporated by reference into the present application for all purposes as if fully set forth herein.

BACKGROUND

Field

Embodiments of the disclosure relate to a display panel and a display device.

Description of Related Art

A display device that implements various information as a screen is a key technology in the era of information and communication technology, and plays a role to display various information in a display area.

Display devices often require excellent display quality and luminous efficiency. In particular, the importance of luminous efficiency is increasing because display devices are required to use limited power according to technological development.

Light efficiency of the display device can be determined by the light emitting element included in the display device. Thus, a display device including a light emitting element having excellent light efficiency can have excellent light efficiency. Therefore, as a method for enhancing the light efficiency of the display device, it can be considered to enhance the light efficiency of the light emitting element in order to enhance the overall light efficiency of the display device. However, it is difficult to enhance the light efficiency of the light emitting element as there are many constraints. Also, during various manufacturing steps, the anode electrode and the light emitting layer of the light emitting element can become damaged, which can result in an impaired subpixel or a dead subpixel. Thus, there exists a need for being able to protect the anode electrode and the light emitting layer of a light emitting element, while also being able to produce a light emitting element that has enhanced light efficiency, improved image quality and reduced power consumption.

SUMMARY OF THE DISCLOSURE

Embodiments of the disclosure relate to a display panel and a display device having a structure capable of enhancing light extraction efficiency along with improved reflectance and reflection visual perception characteristics.

Embodiments of the disclosure relate to a display panel and a display device capable of low-power driving through high luminous characteristics as one subpixel includes a plurality of emission areas to emit light of the same color.

Embodiments of the disclosure relate to a display panel and a display device capable of simplifying the manufacturing process by forming different components through the same process or during the same manufacturing step.

Embodiments of the disclosure can provide a display panel including a plurality of transistors disposed on a substrate, a first planarization layer disposed on the transistor, a second planarization layer disposed on the first planarization layer and including at least one concave portion, an anode electrode disposed in the concave portion of the second planarization layer, a bank disposed on a portion of an upper surface of the anode electrode and the second planarization layer and disposed in a portion of the concave portion of the second planarization layer, a light emitting layer disposed on the anode electrode, and a cathode electrode disposed on the light emitting layer, in which a transmittance of the second planarization layer is lower than a transmittance of the bank.

Embodiments of the disclosure can provide a display device including a first planarization layer disposed on a substrate including a plurality of subpixel areas, a second planarization layer disposed on the first planarization layer and including at least one concave portion, an anode electrode disposed in the concave portion of the second planarization layer, a bank disposed on a portion of an upper surface of the anode electrode and the second planarization layer and disposed in a portion of the concave portion of the second planarization layer, a light emitting layer disposed on the anode electrode, and a cathode electrode disposed on the light emitting layer, in which at least one of the plurality of subpixels includes a first emission area, a first non-emission area surrounding the first emission area, and a second non-emission area surrounding the first non-emission area.

According to embodiments of the disclosure, there can be provided a display panel and a display device capable of enhancing luminance viewing angle characteristics and light extraction efficiency as the planarization layer under the anode electrode absorbs light and includes a concave portion corresponding to the emission area.

According to embodiments of the disclosure, there can be provided a display panel and a display device capable of low-power driving while providing high luminous characteristics as one subpixel includes a plurality of emission areas to emit light in the same color.

According to embodiments of the disclosure, there can be provided a display panel and a display device capable of simplifying the manufacturing process by forming different components through the same process.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION OF THE EMBODIMENTS

Figure 1:
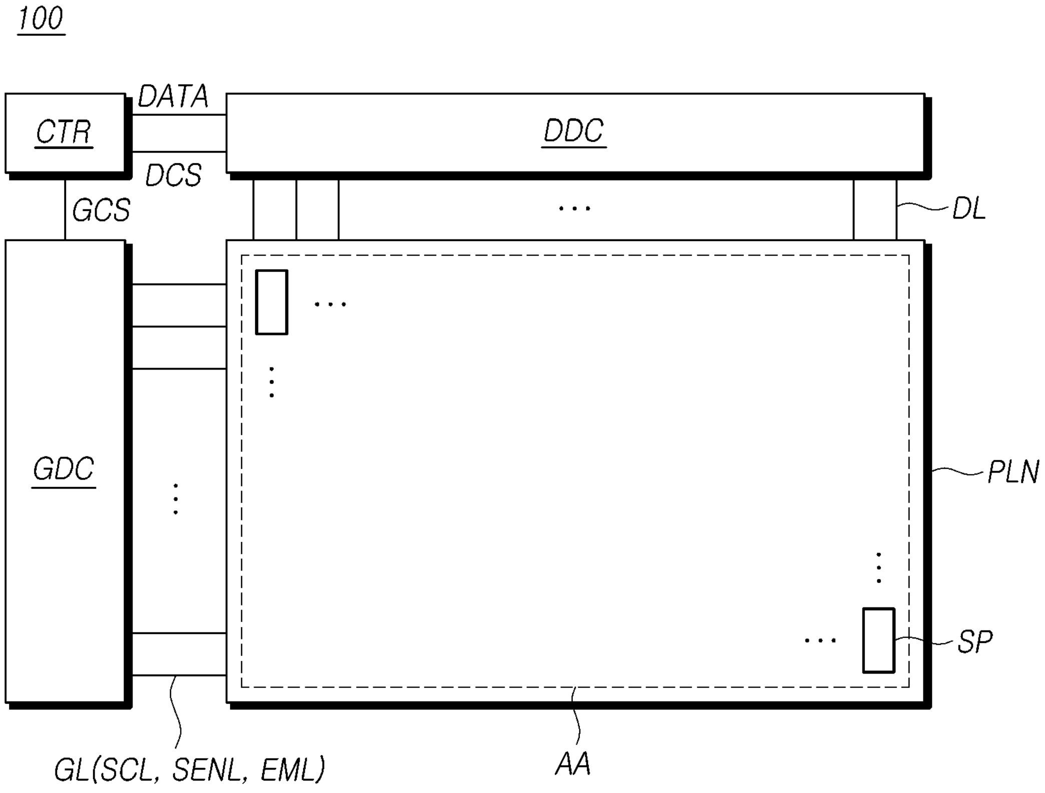
FIG. 1 is a view schematically illustrating a system configuration of an organic light emitting display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description can make the subject matter in some embodiments of the disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" can be used herein to describe elements of the disclosure. Each of these terms is not used to define essence, order, sequence, or number of elements etc., but is used merely to distinguish the corresponding element from other elements.

When it is mentioned that a first element "is connected or coupled to," "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element can be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "can" fully encompasses all the meanings of the term "can."

The features of various embodiments of the present disclosure can be partially or entirely coupled to or combined with each other and can be interlocked and operated in technically various ways, and the embodiments can be carried out independently of or in association with each other.

Hereinafter, various embodiments of the disclosure are described in detail with reference to the accompanying drawings.

FIG. 1 is a view schematically illustrating a system configuration of an organic light emitting display device according to embodiments of the disclosure.

An organic light emitting display device 100 according to embodiments of the disclosure can include the organic light emitting display device 100, a lighting device, or a light emitting device. For convenience of description, the following description focuses primarily on the organic light emitting display device 100. However, embodiments of the disclosure can also be applied to other various organic light emitting display devices 100, such as lighting devices or light emitting devices, as long as they include transistors.

The organic light emitting display device 100 according to embodiments of the disclosure can include a display panel (PLN) for displaying images or outputting light and a driving circuit for driving the display panel (PLN).

The organic light emitting display device 100 according to embodiments of the disclosure can be a bottom emission-type organic light emitting display device, which emits light toward the substrate on which light emitting elements are disposed, but the disclosure is not limited thereto. In some situations, the organic light emitting display device 100 of the disclosure can be a top emission-type electroluminescent display device, which emits light away from the substrate on which light emitting elements are disposed, or a dual emission-type electroluminescent display device which emits light towards and away from the substrate.

The display panel PLN can have a plurality of data lines DL and a plurality of gate lines GL. The display panel PLN can have a plurality of sub-pixels SP, defined by a plurality of data lines DL and a plurality of gate lines GL, arranged in a matrix type.

In the display panel PLN, the plurality of data lines DL and the plurality of gate lines GL can be disposed to cross each other. For example, the plurality of gate lines GL can be arranged in rows or columns, and the plurality of data lines DL can be arranged in columns or rows. For ease of description, it is assumed below that the plurality of gate lines GL are arranged in rows, and the plurality of data lines DL are arranged in columns.

The display panel PLN can have other types of signal lines, as well as the plurality of data lines DL and the plurality of gate lines GL, depending on, e.g., the subpixel structure. The display panel PLN can further have a driving power line, a reference power line, or a common power line.

The type of the signal lines disposed on the panel PLN can be varied depending on, e.g., the subpixel structure. In this disclosure, the concept of signal line can encompass signal-applied electrodes.

The display panel PLN can include an active area A/A for displaying pictures or images and a non-active area N/A, in which no image is displayed, around the active area A/A. The non-active area N/A is also referred to as a bezel area.

The active area A/A includes a plurality of subpixels SP for displaying images.

The non-active area N/A has a pad area for electrical connection with a data driver DDR. The non-active area N/A can have a plurality of data link lines to connect the pad area with the plurality of data lines DL. The plurality of data link lines can be extensions of the plurality of data lines DL to the non-active area N/A or can be separate patterns electrically connected with the plurality of data lines DL.

The non-active area N/A can also include gate driving-related wires to transfer voltage (signals) necessary for gate driving to a gate driver GDR through pads electrically connected with the data driver DDR. For example, the gate driving-related wires can include clock wires for transferring clock signals, gate power wires for transferring gate voltages VGH and VGL, and gate driving control signal wires for transferring various control signals necessary to generate scan signals. The gate driving-related lines are disposed in the non-active area N/A, unlike the gate lines GL disposed in the active area A/A.

The driving circuit can include the data driver DDR for driving the plurality of display device, the gate driver GDR for driving the plurality of gate lines GL, and a controller CTR for controlling the data driver DDR and the gate driver GDR.

The data driver DDR can drive the plurality of data lines DL by outputting data voltage to the plurality of data lines DL.

The gate driver GDR can drive the plurality of gate lines GL by outputting scan signals to the plurality of gate lines GL.

The controller CTR can control the driving operation of the data driver Data driver DDR and gate driver GDR by supplying various control signals DCS and GCS necessary for the driving operation of the data driver DDR and gate driver GDR. Further, the controller CTR can supply image data DATA to the data driver DDR.

The controller (CTR) starts scanning according to the timing implemented in each frame. The controller CTR converts input image data input from the outside (e.g., from a host system) into image data DATA suited for the data signal format used in the data driver DDR, outputs the image data DATA, and controls data driving at an appropriate time suited for scanning.

To control the data driver DDR and gate driver GDR, the controller CTR receives timing signals, such as a vertical sync signal Vsync, horizontal sync signal Hsync, input data enable signal (Data Enable (DE)), or clock signal CLK form the outside (e.g., a host system) and can generate various control signals. The controller CTR outputs the generated control signals to the data driver DDR and the gate driver GDR.

As an example, to control the gate driver GDR, the controller CTR outputs various gate control signals GCS including a gate start pulse GSP, a gate shift clock GSC, and a gate output enable signal (Gate Output Enable, GOE).

To control the data driver DDR, the controller CTR outputs various data control signals DCS including, e.g., a source start pulse SSP, a source sampling clock SSC, and a source output enable signal (Source Output Enable, SOE).

The controller CTR can be a timing controller used in a typical display technology. Alternatively, the controller CTR can be a control device capable of further performing other control functions including the timing controller.

The controller CTR can be implemented as a separate component from the data driver DDR. Alternatively, the controller CTR can be integrated with the data driver DDR in an integrated circuit.

The data driver DDR receives the image data DATA from the controller CTR and supply data voltage to the plurality of data lines DL, thereby driving the plurality of data lines DL. Here, the data driver DDR is also referred to as a source driver.

The data driver DDR can exchange various signals with the controller CTR via various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals of On voltage or Off voltage to the plurality of gate lines GL under the control of the controller CTR.

When a specific gate line is opened by the gate driver GDR, the data driver DDR converts the image data DATA received from the controller CTR into an analog data voltage and supplies the analog data voltage to the plurality of data lines DL.

The data driver DDR can be positioned on one side (e.g., an upper or lower side) of the display panel PLN. However, embodiments of the disclosure are not limited thereto. For example, data drivers DDR can be positioned on both the sides (e.g., both the upper and lower sides) of the display panel PLN depending on a driving scheme or a display panel design scheme.

The gate driver GDR can be positioned on one side (e.g., a left or right side) of the display panel PLN. However, embodiments of the disclosure are not limited thereto. For example, gate drivers GDR can be positioned on both the sides (e.g., both the left and right sides) of the display panel PLN depending on a driving scheme or a display panel design scheme.

The data driver DDR can include one or more source driver integrated circuits (SDICs).

Each source driver integrated circuit (SDIC) can include a shift register, a latch circuit, a digital-to-analog converter (DAC), and an output buffer. In some situations, the data driver DDR can further include one or more analog-digital converters ADC.

Each source driver integrated circuit SDIC can be connected, in a tape automated bonding (TAB) type or chip-on-glass (COG) type, to the bonding pad of the display panel PLN. Alternatively, each source driver integrated circuit SDIC can be directly disposed on the display panel PLN. In some situations, each source driver integrated circuit (SDIC) can be integrated and disposed on the display panel PLN. Each source driver integrated circuit (SDIC) can be implemented in a chip-on-film (COF) type. In this situation, each source driver integrated circuit SDIC can be mounted on a circuit film. Each source driver integrated circuit SDIC mounted on the circuit film can be electrically connected to the data lines DL of the display panel PLN through the circuit film.

The gate driver GDR can include a plurality of gate driving circuits GDC. The plurality of gate driving circuits can respectively correspond to the plurality of gate lines GL.

Each gate driving circuit GDC can include, e.g., a shift register and a level shifter.

Each gate driving circuit GDC can be connected, in a tape automated bonding (TAB) type or chip-on-glass (COG) type, to the bonding pad of the display panel PLN. Each gate driving circuit GDC can be implemented in a chip-on-film (COF) scheme. In this situation, each gate driving circuit GDC can be mounted on a circuit film. Each gate driving circuit GDC mounted on the circuit film can be electrically connected to the gate lines GL of the display panel PLN through the circuit film. Each gate driving circuit GDC can be implemented in a gate-in-panel (GIP) type and be embedded in the display panel PLN. Accordingly, each gate driving circuit GDC can be directly formed on the display panel PLN.

Figure 2:
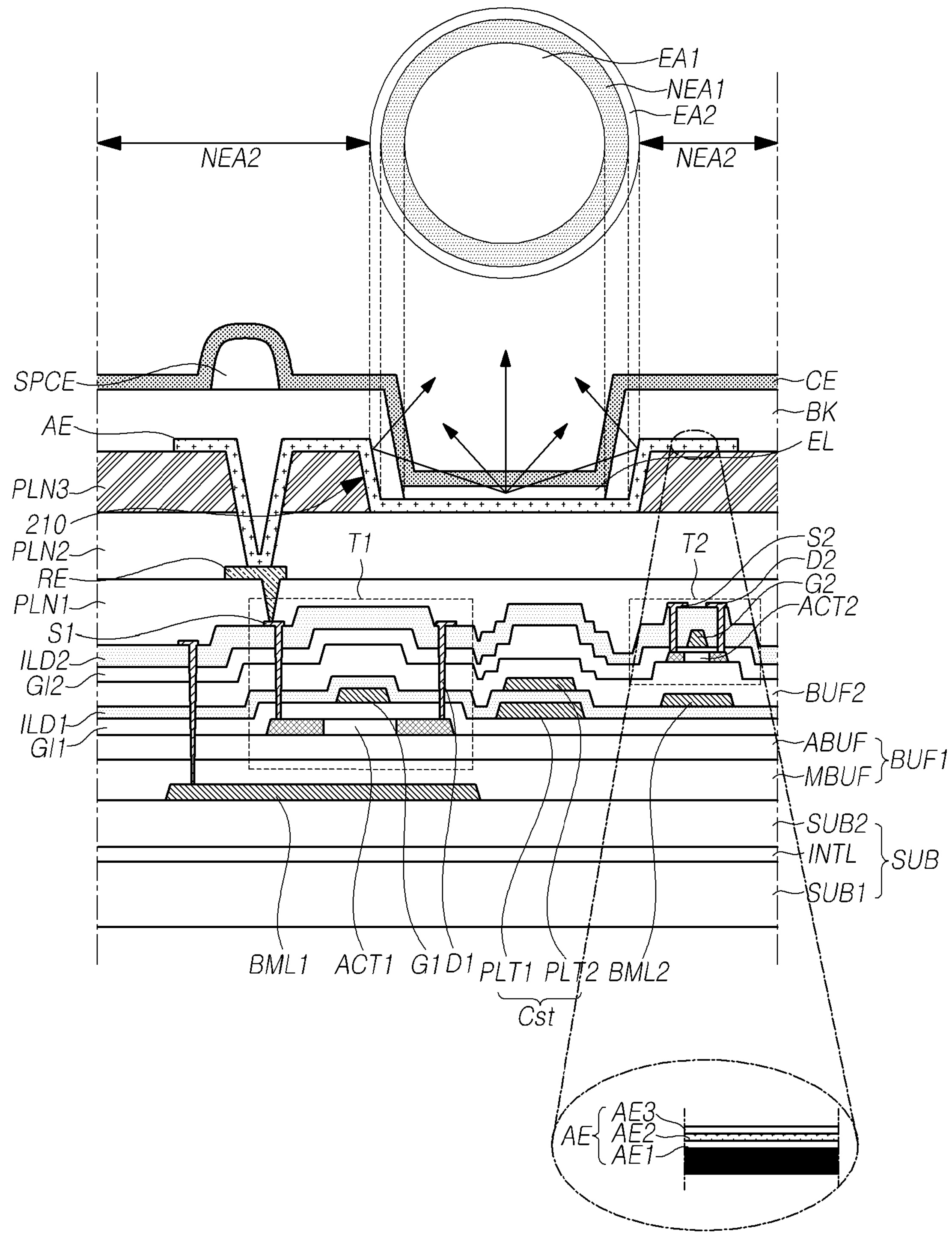
FIG. 2 is a view illustrating a partial structure of an active area in a display panel according to embodiments of the disclosure.

FIG. 2 is a view illustrating a partial structure of an active area in a display panel according to embodiments of the disclosure.

Referring to FIG. 2, when viewed in a vertical structure, the display panel 110 can include a transistor forming part, a light emitting element forming part, and an encapsulation part.

The transistor forming part can include a substrate SUB, a first buffer layer BUF1 on the substrate SUB, and various transistors T1 and T2, storage capacitor Cst, and various electrodes or signal lines formed on the first buffer layer BUF1.

The substrate SUB can include a first substrate SUB1 and a second substrate SUB2. An intermediate film INTL can be present between the first and second substrates SUB1 and SUB2. For example, the intermediate film INTL can be an inorganic film and can block moisture penetration.

The first buffer layer BUF1 can be a single film or multi-film structure. When the first buffer layer BUF1 is formed in a multi-film structure, the first buffer layer BUF1 can include a multi-buffer layer MBUF and an active buffer layer ABUF.

A first light blocking layer BML1 can be disposed between the first buffer layer BUF1 and the substrate SUB.

Meanwhile, referring to FIG. 2, the first light blocking layer BML1 can overlap the whole or part of the first active layer ACT1.

For example, the first light blocking layer BML1 can serve as a light shield to block the light introduced from thereunder. In this situation, the first light blocking layer BML1 can be electrically connected to the first source electrode S1. The first light blocking layer BML1 can be disposed under the first transistor T1 and can protect the first transistor T1 from light introduced from thereunder.

Various transistors T1 and T2, storage capacitor Cst, and various electrodes or signal lines can be formed on the first buffer layer BUF1.

For example, the transistors T1 and T2 formed on the first buffer layer BUF1 are formed of the same material and on the same layer. Alternatively, as illustrated in FIG. 2, among the transistors T1 and T2, the first driving transistor T1 and the second driving transistor T2 can be formed of different materials and can be positioned on different layers.

Referring to FIG. 2, the first driving transistor T1 can include a first active layer ACT1, a first gate electrode G1, a first source electrode S1, and a first drain electrode D1.

The second transistor T2 can include a second active layer ACT2, a second gate electrode G2, a second source electrode S2, and a second drain electrode D2.

The second active layer ACT2 of the second transistor T2 can be positioned higher than the first active layer ACT1 of the first transistor T1.

The first buffer layer BUF1 can be disposed under the first active layer ACT1 of the first transistor T1, and a second buffer layer BUF2 can be disposed under the second active layer ACT2 of the second transistor T2.

Further, a second light blocking layer BML2 can be disposed under the second active layer ACT2.

In other words, the first active layer ACT1 of the first transistor T1 can be positioned on the first buffer layer BUF1, and the second active layer ACT2 of the second transistor T2 can be positioned on the second buffer layer BUF2. Here, the second buffer layer BUF2 can be positioned higher than the first buffer layer BUF1.

The first active layer ACT1 of the first transistor T1 can be disposed on the first buffer layer BUF1, and a first gate insulation film GI1 can be formed on the first active layer ACT1 of the first transistor T1. The second gate electrode G2 of the second transistor T2 can be disposed on the first gate insulation film GI1, and a first inter-layer insulation film ILD1 can be disposed on the second gate electrode G2 of the second transistor T2.

Here, the first active layer ACT1 of the first transistor T1 can include a first channel area overlapping with the first gate electrode G1, a first source connection area positioned on one side of the first channel area, and a channel area, and a first drain connection area positioned on the other side of the channel area.

A second buffer layer BUF2 can be disposed on the first inter-layer insulation film ILD1.

The second active layer ACT2 of the second transistor T2 can be disposed on the second buffer layer BUF2, and a second gate insulation film GI2 can be disposed on the second active layer ACT2. The second gate electrode G2 of the second transistor T2 can be disposed on the second gate insulation film GI2, and a second inter-layer insulation film ILD2 can be disposed on the second gate electrode G2.

Here, the second active layer ACT2 of the second transistor T2 can include a second channel area overlapping with the second gate electrode G2, a second source connection area positioned on one side of the second channel area, and a second drain connection area positioned on the other side of the second channel area.

The first source electrode S1 and the first drain electrode D1 of the first transistor T1 can be disposed on the second inter-layer insulation film ILD2. The second source electrode S2 and the second drain electrode D2 of the second transistor T2 can be disposed on the second inter-layer insulation film ILD2.

The first source electrode S1 and the first drain electrode D1 of the first transistor T1 can be connected with the first source connection area and the first drain connection area, respectively, of the first active layer ACT1 through the through holes of the second inter-layer insulation film ILD2, the second gate insulation film GI2, the second buffer layer BUF2, the first inter-layer insulation film ILD1, and the first gate insulation film GI1.

The second source electrode S2 and the second drain electrode D2 of the second transistor T2 can be connected with the second source connection area and the second drain connection area, respectively, of the second active layer ACT2 through the through holes in the second inter-layer insulation film ILD2 and the second gate insulation film GI2.

Referring to FIG. 2, the storage capacitor Cst can include a first capacitor electrode PLT1 and a second capacitor electrode PLT2. The storage capacitor Cst can be disposed between the first transistor T1 and the second transistor T2.

Referring to FIG. 2, a first planarization layer PLN1 can be disposed on the first transistor T1 and the second transistor T2. In other words, the first planarization layer PLN1 can be disposed on the first source electrode S1 and the first drain electrode D2 of the first transistor T1 and the second source electrode S2 and the second drain electrode D2 of the second transistor T2.

Referring to FIG. 2, a relay electrode RE can be disposed on the first planarization layer PLN1.

The relay electrode RE can be an electrode that relays an electrical connection between the first source electrode S1 of the first transistor T1 and the anode electrode AE of the light emitting element ED.

The relay electrode RE can be electrically connected to the first source electrode S1 of the first transistor T1 through a hole in the first planarization layer PLN1.

A second planarization layer PLN2 can be disposed on the relay electrode RE and the first planarization layer PLN1.

A third planarization layer PLN3 can be disposed on the second planarization layer PLN2. The anode electrode AE of the light emitting element ED can be electrically connected to the relay electrode RE through contact hole areas of the second planarization layer PLN2 and the third planarization layer PLN3.

Although FIG. 2 illustrates a structure in which the second planarization layer PLN2 is disposed on the first planarization layer PLN1 and the third planarization layer PLN3 is disposed on the second planarization layer PLN2, embodiments of the disclosure are not limited thereto. For example, the third planarization layer PLN3 can be disposed on the first planarization layer PLN1 or only the third planarization layer PLN3 can be disposed on the substrate SUB1.

The transmittance of the third planarization layer PLN3 can be different than the transmittances of the first and second planarization layers PLN1 and PLN2.

Specifically, the transmittance of the third planarization layer PLN3 can be lower than the transmittances of the first and second planarization layers PLN1 and PLN2. For example, the third planarization layer PLN3 can be formed in a black color and absorb light. Even though the third planarization layer PLN3 is shown in the drawings with diagonal hashing for convenience of description, the third planarization layer PLN3 can be formed to have a solid black color or a solid opaque color that can fully or at least partially block light, but embodiments are not limited thereto. The first and second planarization layers PLN1 and PLN2 can transmit light.

The third planarization layer PLN3 can include at least one concave portion 210.

Meanwhile, although FIG. 2 illustrates that the concave portion 210 of the third planarization layer PLN3 has a shape exposing a portion of the upper surface of the second planarization layer PLN2, embodiments of the disclosure are not limited thereto. For example, the concave portion 210 of the third planarization layer PLN3 may not expose the upper surface of the second planarization layer PLN2. For example, the concave portion 210 of the third planarization layer PLN3 can be a type of concave hole that extends all the way through the third planarization layer PLN3 to expose a portion of the upper surface of the second planarization layer PLN2, but embodiments are not limited thereto. According to another embodiment, the concave portion 210 of the third planarization layer PLN3 can be a depression or a divot in an upper surface of the third planarization layer PLN3 without extending all the way through the third planarization layer PLN3.

In this situation, the height of the third planarization layer PLN3 in the area where the concave portion 210 is positioned is lower than the height of the third planarization layer PLN3 in the area where the concave portion 210 is not formed (except for the contact hole area). The third planarization layer PLN3 can include at least two concave portions 210 including the contact hole area. In this situation, the height of the contact hole area positioned in the second planarization layer PLN2 and the third planarization layer PLN3 can be larger than the height of the third planarization layer PLN3 in the area where the concave portion 210 is positioned. Further, the width of the concave portion 210 can be larger than the width of the contact hole area.

The anode electrode AE of the light emitting element ED can be disposed on the second planarization layer PLN2 and the third planarization layer PLN3.

The anode electrode AE can include a reflective electrode capable of reflecting light.

The anode electrode AE can be a single layer, but the structure of the anode electrode AE according to embodiments of the disclosure is not limited thereto.

As illustrated in FIG. 2, the anode electrode AE can have a multilayer structure, in which the anode electrode AE can include at least one reflective electrode layer and at least one transparent conductive material layer. For example, the anode electrode AE can have a three-layer structure, including a first transparent conductive material layer AE1, a reflective electrode layer AE2 disposed on the first transparent conductive material layer AE1, and a second transparent conductive material layer AE3 disposed on the reflective electrode layer AE2.

The first and second transparent conductive material layers AE1 and AE3 of the anode electrode AE can include at least one of indium tin oxide (ITO), indium zinc oxide (IZO), or indium gallium zinc oxide (IGZO), but are not limited thereto.

The reflective electrode layer AE2 of the anode electrode AE can include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

Here, the thickness of the first transparent conductive material layer AE1 contacting the third planarization layer PLN3 can be larger than the thickness of the second transparent conductive material layer AE3. Thus, reaction components or outgassing (e.g., impurities) generated from the third planarization layer PLN3 can be blocked, thereby preventing the reaction components from affecting the light emitting layer EL. In this situation, the thickness of the first transparent conductive material layer AE1 can be smaller than the thickness of the reflective electrode layer AE2 including a metal or a metal alloy.

Referring to FIG. 2, the anode electrode AE can be disposed in the concave portion 210 of the third planarization layer PLN3. Specifically, the anode electrode AE can be disposed on the bottom and side surfaces of the concave portion 210 provided in the third planarization layer PLN3 and extend to a portion of the upper surface of the third planarization layer PLN3.

Further, the anode electrode AE can be disposed on a portion of the upper surface of the third planarization layer PLN3 and can also be disposed in the contact hole provided in the third planarization layer PLN3 and the second planarization layer PLN2.

Accordingly, as illustrated in FIG. 2, the anode electrode AE can contact the upper surface of the second planarization layer PLN2 in an area corresponding to the concave portion 210 of the third planarization layer PLN3. Further, the anode electrode AE can contact the relay electrode RE disposed under the second planarization layer PLN2 through contact holes provided in the third planarization layer PLN3 and the second planarization layer PLN2.

A bank BK can be disposed on the anode electrode AE and the third planarization layer PLN3.

The bank BK can include a bank hole exposing a portion of the upper surface of the anode electrode AE. In other words, one bank hole formed in the bank BK can overlap with a portion of one anode electrode AE.

Referring to FIG. 2, the bank BK can also overlap with a portion of the concave portion 210 of the third planarization layer PLN3. Specifically, the bank BK is disposed on the side surface of the third planarization layer PLN3 in the concave portion 210 of the third planarization layer PLN3, and can also be disposed on a portion of the upper surface of the anode electrode AE. For example, a portion of the bank BK can extend into the in the concave portion 210 of the third planarization layer PLN3 and be disposed between a portion of the anode electrode AE and portions of the light emitting layer EL and the cathode electrode CE (e.g., in the side wall area). For instance, the portion of the bank BK that is disposed between the portion of the anode electrode AE and portions of the light emitting layer EL and the cathode electrode CE can correspond to a first non-emission area NEA1. The bank BK can also overlap with the contact hole area. Specifically, the bank BK can fill the contact hole areas formed in the second planarization layer PLN2 and the third planarization layer PLN3. The height of the bank BK in the contact hole area can be larger than the height of the bank BK partially overlapping the concave portion 210 (e.g., the bank BK can include a protrusion portion in the contact hole area that extends toward the substrate SUB).

Referring to FIG. 2, the light emitting layer EL of the light emitting element ED can be disposed in the bank hole that partially exposes the upper surface of the anode electrode AE. In other words, the light emitting layer EL can be disposed on the upper surface of the anode electrode AE that does not overlap with the bank BK.

However, the structure of the light emitting layer EL according to embodiments of the disclosure is not limited thereto, and the light emitting layer EL can be disposed in the bank hole and be additionally disposed on the upper surface of the bank.

In this situation, the light emitting layer EL can include areas having different thicknesses. Specifically, the thickness of the light emitting layer EL in the area where the bank hole exposing a portion of the upper surface of the anode electrode AE is positioned in the concave portion 210 of the third planarization layer PLN3 corresponding to the first emission area EA1 in the subpixel can be larger than the thickness of the light emitting layer EL in the area corresponding to the inclined surface of the concave portion 210 corresponding to the second emission area EA2.

Further, the thickness of the anode electrode AE in the area where the bank hole exposing a portion of the upper surface of the anode electrode AE is positioned in the concave portion 210 of the third planarization layer PLN3 corresponding to the first emission area EA1 in the subpixel can be larger than the thickness of the anode electrode AE in the area corresponding to the inclined surface of the concave portion 210 corresponding to the second emission area EA2.

Thus, the current path can be lengthened, preventing generation of a lateral leakage current between adjacent subpixels.

However, the following description focuses primarily on a structure in which the light emitting layer EL is disposed on the upper surface of the anode electrode AE that does not overlap with the bank BK for convenience of description.

Referring to FIG. 2, the light emitting layer EL can be disposed in the concave portion 210 of the third planarization layer PLN3.

Referring to FIG. 2, the cathode electrode CE of a light emitting element ED can be disposed on the light emitting layer EL and the bank BK.

The cathode electrode CE can be formed of a layer including a transparent conductive material. Further, the cathode electrode CE can be formed of a layer including a translucent electrode formed of a metal or a metal alloy.

At least one spacer SPCE can be present between the cathode electrode CE and the bank BK. At least one spacer SPCE can be disposed to overlap with the contact hole area. Also, according to an embodiment, a center of the spacer SPCE can be aligned with a center of the contact hole, but embodiments are not limited thereto. As the contact hole areas formed in the second planarization layer PLN2 and the third planarization layer PLN3 are filled with the bank BK and the spacer SPCE is formed over the contact hole area, the height of the bank BK in the contact hole area including the spacer SPCE can be larger than the height of the bank BK partially overlapping the concave portion 210.

The spacer SPCE can be formed of the same material as the bank BK, but embodiments of the disclosure are not limited thereto.

The bank BK and the spacer SPCE can be formed of a transparent insulating material.

The transmittance of the bank BK can be higher than the transmittance of the third planarization layer PLN3. For example, the third planarization layer PLN3 can block or absorb light, while the bank BK can be transparent and allow light to pass therethrough.

The display panel 110 according to embodiments of the disclosure can have a structure in which one subpixel includes a plurality of emission areas EA1 and EA2. Also, the one subpixel can have a circle shape in a plan view, but embodiments are not limited thereto. For example, the one subpixel can have a polygonal shape, a square shape, an oval shape, a hexagon shape, a triangle shape, or a shape with rounded corners.

Specifically, referring to FIG. 2, the area where the bank BK is not disposed on the anode electrode AE can be a first emission area EA1 included in one subpixel. In other words, the area where the bank hole exposing a portion of the upper surface of the anode electrode AE is positioned in the concave portion 210 of the third planarization layer PLN3 can be the first emission area EA1 of the subpixel.

Referring to FIG. 2, the first emission area EA1 can be surrounded by the first non-emission area NEA1 in the plan view. The first non-emission area NEA1 can correspond to the area where the bank BK overlaps with the anode electrode AE in a space between the anode electrode AE and the light emitting layer EL (e.g., near the inclined side surface of the anode electrode AE).

The first non-emission area NEA1 can be surrounded by the second emission area EA2 included in one subpixel in the plan view.

The first emission area EA1 and the second emission area EA2 can be areas emitting light of the same color.

The first non-emission area NEA1 can be an area between the area where the anode electrode AE not overlapping with the bank BK is disposed and the area corresponding to the inclined side surface of the third planarization layer PLN3 provided by the concave portion 210 of the third planarization layer PLN3.

The first non-emission area NEA1 can be an area that is in a black state when the display panel is in an on state. Alternatively, the first non-emission area NEA1 can be an area that has a luminance lower than the luminance of the first emission area EA1 and the second emission area EA2 due to the light incident from at least one emission area of the first emission area EA1 and the second emission area EA2.

The second emission area EA2 can be an area corresponding to an inclined side surface of the third planarization layer PLN3 provided by the concave portion 210 provided in the third planarization layer PLN3 in cross-sectional view.

The second emission area EA2 can be an area formed as light emitted from the light emitting element ED is reflected off of the anode electrode due to the portion of the anode electrode AE that is disposed on the inclined side surface of the second planarization layer PLN2 provided by the concave portion 210 provided in the third planarization layer PLN3.

Referring to FIG. 2, the second non-emission area NEA2 can be disposed to surround the second emission area EA2 in the plan view.

The second non-emission area NEA2 can include an area in which the bank BK is disposed, and can include an area other than an area corresponding to the bottom of the concave portion 210 and the side surface of the concave portion 210 of the third planarization layer PLN3.

The second non-emission area NEA2 can be an area between the second emission area EA2 of one subpixel and the second emission area EA2 of another subpixel.

As described above, in the display panel 110 according to embodiments of the disclosure, the area of the emission area included in one subpixel can be increased due to the anode electrode EA including the reflective electrode disposed in the concave portion 210 provided in the third planarization layer PLN3.

In the display panel 110 according to embodiments of the disclosure, the third planarization layer PLN3 can be formed in a color that absorbs light, and the bank BK can be transparent. For example, the third planarization layer PLN3 can be black or a dark color.

As illustrated in FIG. 2, part of the light emitted from the light emitting element ED can be emitted from the light emitting layer EL toward the cathode electrode CE. In this situation, the light emitted from the light emitting element ED can include light that travels from the light emitting layer EL to the anode electrode AE and is reflected by the anode electrode AE including the reflective electrode to the outside of the cathode electrode CE.

Further, another part of the light emitted from the light emitting element ED can pass through the bank BK disposed in the concave portion 210 of the third planarization layer PLN3 to reach the anode electrode AE disposed between the third planarization layer PLN3 and the bank BK, since the bank BK can have transparency. In this situation, light can be reflected by the anode electrode AE including the reflective electrode and emitted to the outside of the cathode electrode CE.

In the display panel 110 according to embodiments of the disclosure, as the bank BK disposed in the concave portion 210 of the third planarization layer PLN3 is formed of a transparent material, it is possible to lead light (e.g., the light emitted from the light emitting element) to pass through the bank BK without loss and be reflected by the anode electrode AE disposed on the inclined surface of the concave portion 210 of the third planarization layer PLN3, and be finally emitted to the outside of the display panel 110. Accordingly, the light efficiency of the display panel 110 can be enhanced.

Further, as the third planarization layer PLN3 is formed of a colored material that absorbs light, light emitted from one subpixel is not transferred to another adjacent subpixel including an emission area that emits light of a different color. In other words, light leakage or light mixing can be reduced or prevented through the third planarization layer PLN3. Also, since the planarization layer PLN3 blocks light and can be disposed on the same layer as the anode electrode AE and the light emitting layer EL, the device can have a thinner profile, and the size and weight can be reduced.

FIG. 2 illustrates a structure in which the concave portion 210 is provided in the third planarization layer PLN3, but the structure according to embodiments of the disclosure is not limited thereto.

For example, an additional concave portion can also be provided in the second planarization layer PLN2 disposed under the third planarization layer PLN3 (e.g., the concave portion can be extended via a depression or divot provided in the second planarization layer PLN2).

This structure is described below with reference to FIG. 3.

Figure 3:
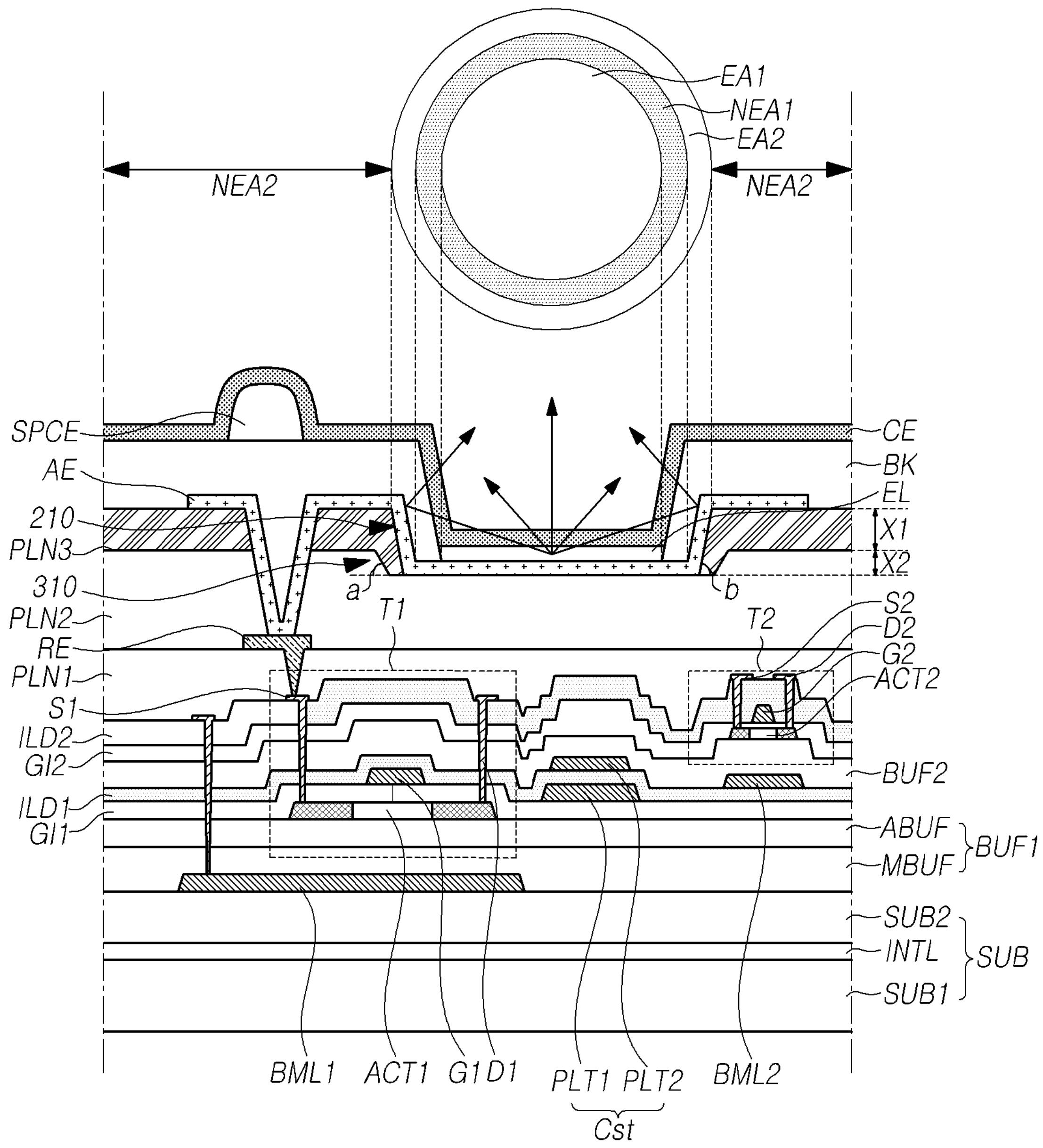
FIG. 3 is a view illustrating a structure of a display panel according to embodiments of the disclosure.

FIG. 3 is a view illustrating a structure of a display panel according to embodiments of the disclosure.

Referring to FIG. 3, in the display panel 110 according to embodiments of the disclosure, the third planarization layer PLN3 can include the concave portion 210 in an area overlapping with the first emission area EA1.

Further, the second planarization layer PLN2 disposed under the third planarization layer PLN3 can include an additional concave portion 310.

Referring to FIG. 3, the additional concave portion 310 provided in the second planarization layer PLN2 can be aligned with and overlap with the concave portion 210 provided in the third planarization layer PLN3. For example, a center of the additional concave portion 310 provided in the second planarization layer PLN2 can be aligned with a center of the concave portion 210 provided in the third planarization layer PLN3, but embodiments are not limited thereto.

The concave portion 210 of the third planarization layer PLN3 can expose an upper surface of the second planarization layer PLN2. Here, the concave portion 210 of the third planarization layer PLN3 can be disposed to expose the upper surface of the second planarization layer PLN2 in an area in which the additional concave portion 310 of the second planarization layer PLN2 is provided.

A height X1 of the concave portion 210 of the third planarization layer PLN3 can be larger than a height X2 of the additional concave portion 310 of the second planarization layer PLN2.

In the display panel 110 illustrated in FIG. 3, the height of the concave portion of the planarization layer provided in the corresponding subpixel can be the sum of the height X1 of the concave portion 210 of the third planarization layer PLN3 and the height X2 of the additional concave portion 210 of the second planarization layer PLN2.

The additional concave portion 310 of the second planarization layer PLN2 does not expose the upper surface of the first planarization layer PLN1 disposed under the second planarization layer PLN2, but the structure of the display panel 110 according to embodiments of the disclosure is not limited thereto. For example, the second planarization layer PLN2 can be disposed to expose a portion of the upper surface of the first planarization layer PLN1 due to the additional concave portion 310 (e.g., the additional concave portion 310 can extend all the way through the second planarization layer PLN2 according to an embodiment).

Referring to FIG. 3, a first inclination angle α of the side surface (e.g., the side surface of the additional concave portion) of the second planarization layer PLN2 where the additional concave portion 310 is formed can be smaller than a second inclination angle b of the side surface (e.g., the side surface of the concave portion) of the third planarization layer PLN3 where the concave portion 210 is formed. For example, the slope of the inclined side surface of the third planarization layer PLN3 can be steeper than the slope of the inclined side surface of the second planarization layer PLN2.

Here, the first and second inclination angles a and b can refer to angles formed by the surface of the substrate SUB and the respective side surfaces of the planarization layers.

As the first inclination angle a is formed to be smaller than the second inclination angle b, the step of the side surface of the third planarization layer PLN3 disposed in the additional concave portion 310 can be increased.

Accordingly, in the additional concave portion 310 and the concave portion 210, the area of the anode electrode AE disposed on the side surface of the third planarization layer PLN3 can increase, and the area of the second emission area EA2 corresponding to the side surface of the third planarization layer PLN3 can also increase. Also, according to another embodiment, the first planarization layer PLN1 can have a third concave portion that can overlap with the concave portion 210 in the third planarization layer PLN3 and the additional concave portion 310 in the second planarization layer PLN2, and a portion of the anode electrode can be disposed in the third concave portion in the first planarization layer PLN1.

Accordingly, the luminance of the subpixel provided with the additional concave portion 310 can be further increased.

In FIGS. 2 and 3, at least one spacer SPCE can be disposed on the bank BK.

The spacer SPCE can serve to prevent the mask used when depositing the light emitting layer EL from contacting the substrate SUB and damaging components disposed on the substrate SUB.

The spacer SPCE can be formed through the same process as the bank BK and include a same material.

This is discussed below with reference to FIGS. 4 and 5.

Figure 4:
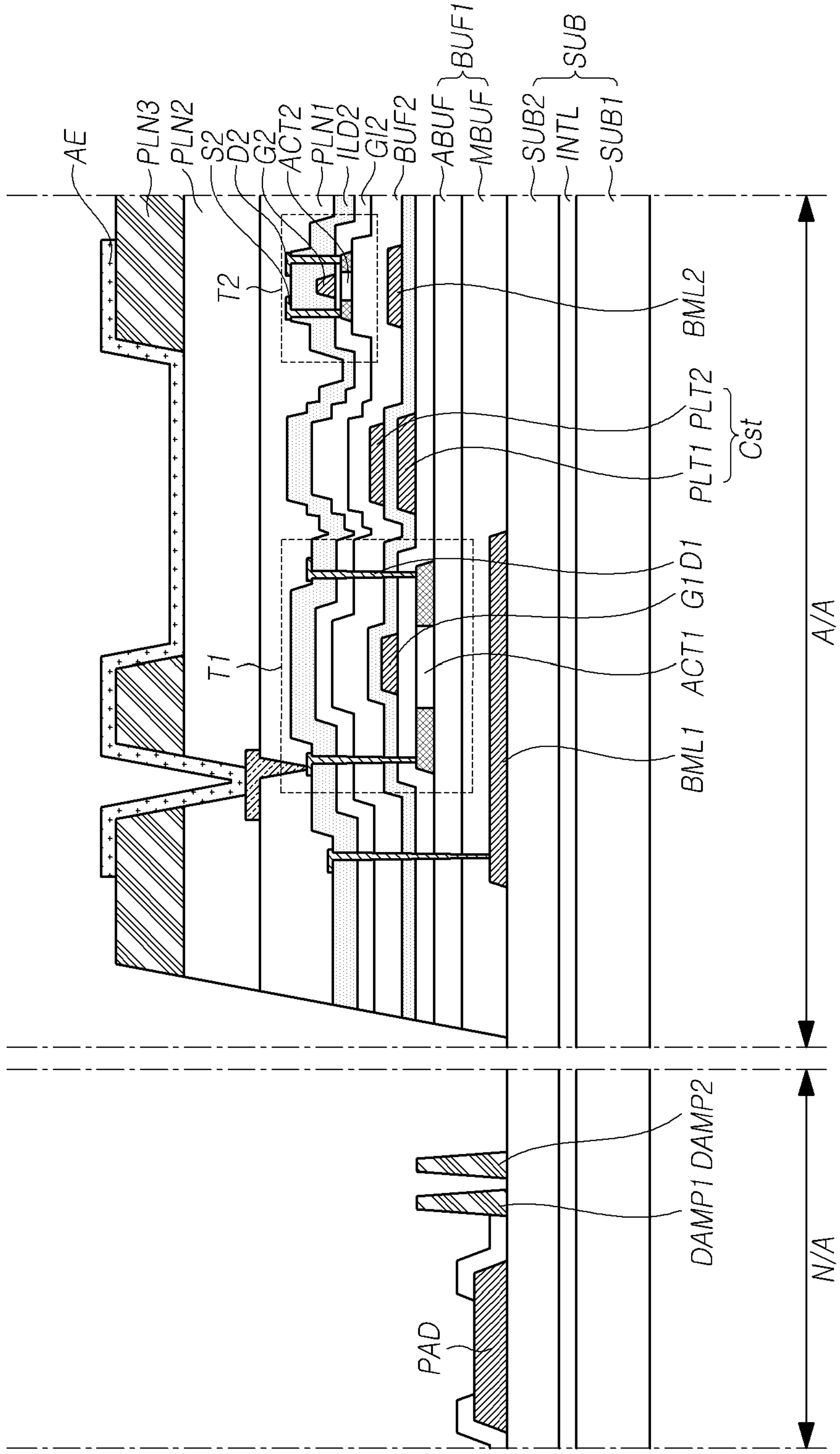
FIGS. 4 and 5 are views schematically illustrating a process of forming a bank and a spacer according to embodiments of the disclosure.
Figure 5:
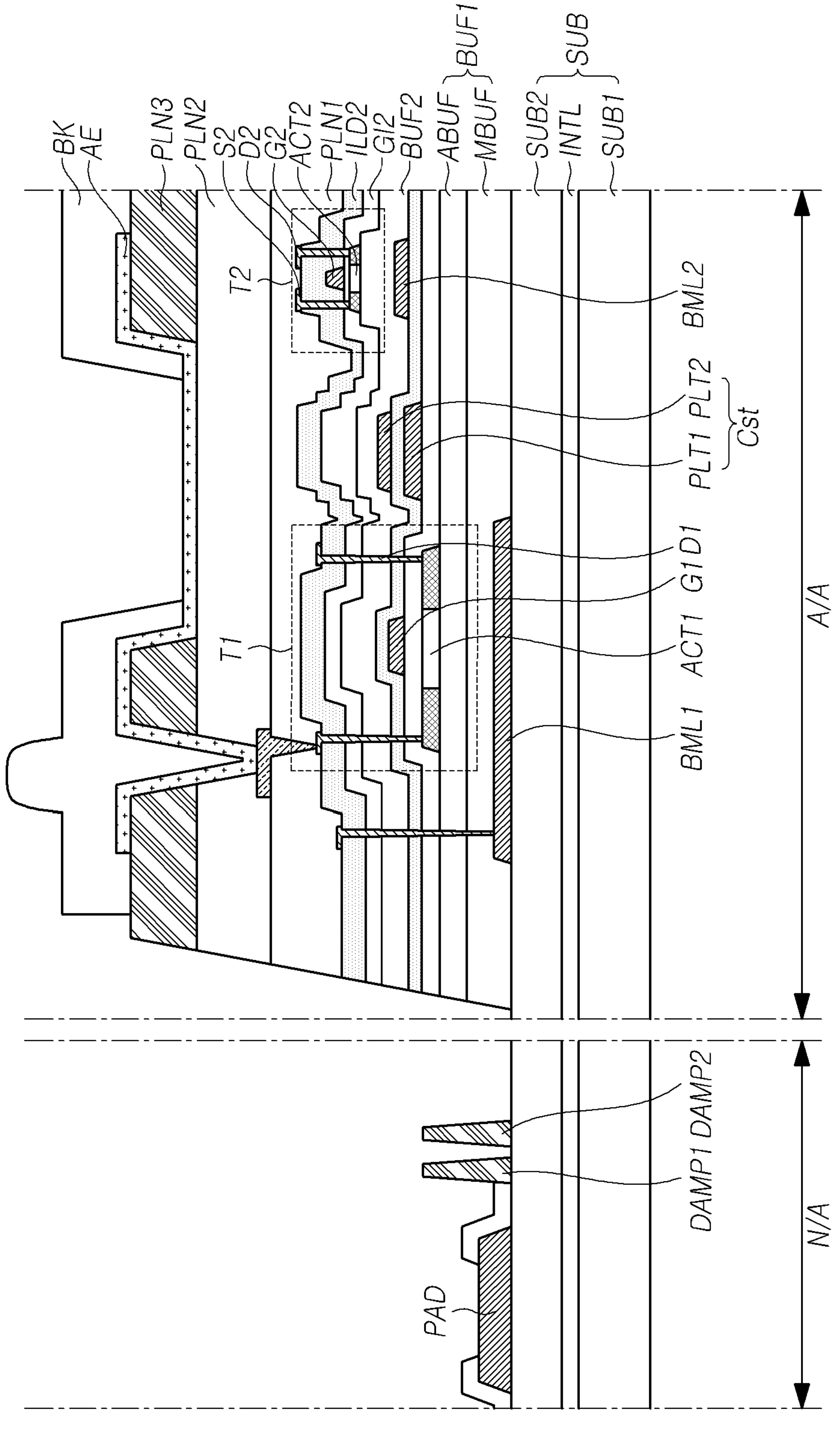

FIGS. 4 and 5 are views schematically illustrating a process of forming a bank and a spacer.

Referring to FIGS. 4 and 5, a first light blocking layer BML1, a first buffer layer BUF1, transistors T1 and T2, a first planarization layer PLN1, and a second planarization layer PLN2 can be sequentially disposed on the substrate SUB, and a third planarization layer PLN3 having a concave portion 210 overlapping the first emission area EA1 and the second emission area EA2 can be disposed on the second planarization layer PLN2.

Referring to FIGS. 4 and 5, at least one pad electrode PAD can be disposed in a pad area included in the non-active area N/A.

The pad electrode PAD can be formed through the same process as at least one of the first light blocking layer BML1, the first gate electrode G1, the second light blocking layer BML2, the second gate electrode G2, the first source electrode S1, the second source electrode S1, the first drain electrode D1, and the second drain electrode D2 disposed in the active area A/A and can include a same material.

Referring to FIGS. 4 and 5, a dam DAM disposed in the non-active area N/A can be included.

The dam DAM can include a first dam pattern DAMP1 and a second dam pattern DAMP2 spaced apart from each other. The first dam pattern DAMP1 and the second dam pattern DAMP2 can be formed through the same process as the third planarization layer PLN3 and can include a same material.

In other words, the first dam pattern DAMP1 and the second dam pattern DAMP2 can be formed of a material that absorbs light.

Referring to FIGS. 4 and 5, the third planarization layer PLN3 can also be disposed on a portion of the upper surface of the pad electrode PAD. As described above, as the third planarization layer PLN3 formed of a light absorbing material is disposed around the pad electrode PAD, it is possible to suppress degradation of visual perception due to reflection caused by the pad electrode PAD.

Referring to FIGS. 4 and 5, an anode electrode AE can be disposed on the third active layer PLN3.

A bank material can be disposed on the substrate SUB where the anode electrode AE is disposed.

The bank material disposed on the substrate SUB can be patterned through a halftone mask. Accordingly, since the bank BK and the spacer SPCE can be formed in the same process and of the same material, the process can be simplified.

As the bank BK and the spacer SPCE are formed using the same mask, even if a process of forming the concave portion 210 using the third planarization layer PLN3 having a different material than the first and second planarization layers PLN1 and PLN2 is added, the overall process of manufacturing the display panel can include no additional process.

Figure 6:
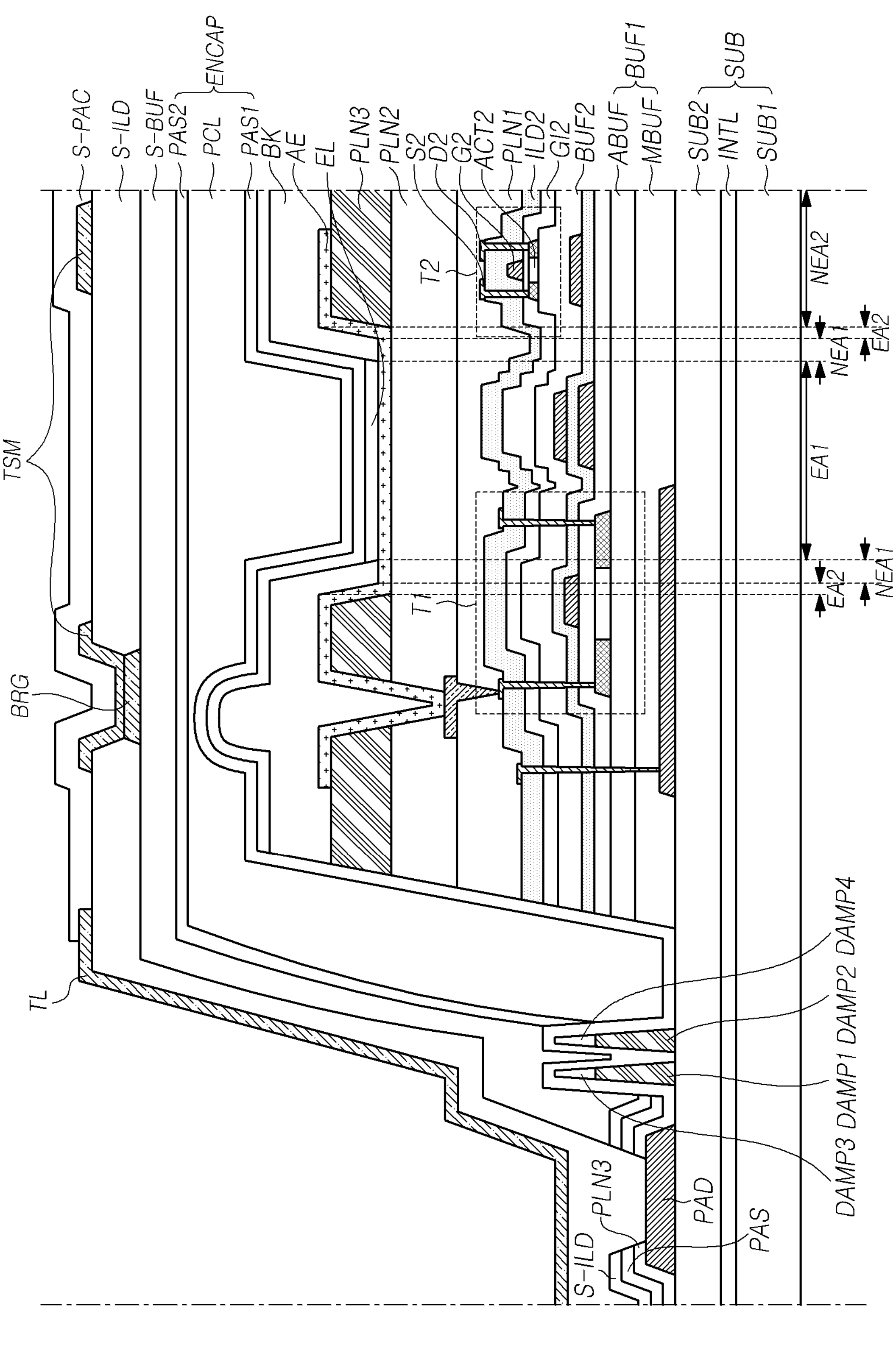
FIGS. 6 and 7 are cross-sectional views illustrating a structure of a display device according to embodiments of the disclosure.

Referring to FIG. 6, a third dam pattern DAMP3 can be disposed on the first dam pattern DAMP1, and a fourth dam pattern DAMP4 can be formed on the second dam pattern DAMP2.

The third dam pattern DAMP3 and the fourth dam pattern DAMP4 can be formed in the same process and of the same material as the process of forming the bank BK and the spacer SPCE.

Although the structure in which the spacer SPCE is disposed on the bank BK has been described with reference to FIGS. 2 to 5, the structure of the display device according to embodiments of the disclosure is not limited thereto, and the spacer SPCE may not be disposed on the bank BK.

Further, in FIGS. 4 and 5, it has been described that the spacer SPCE is formed by the same process as the process of forming the bank BK, but the process of the display device according to embodiments of the disclosure is not limited thereto, and the process of forming the spacer SPCE and the process of forming the bank BK can be separately performed.

Next, a structure of a display device according to an embodiment of the disclosure is further described with reference to FIGS. 6 and 7.

Figure 7:
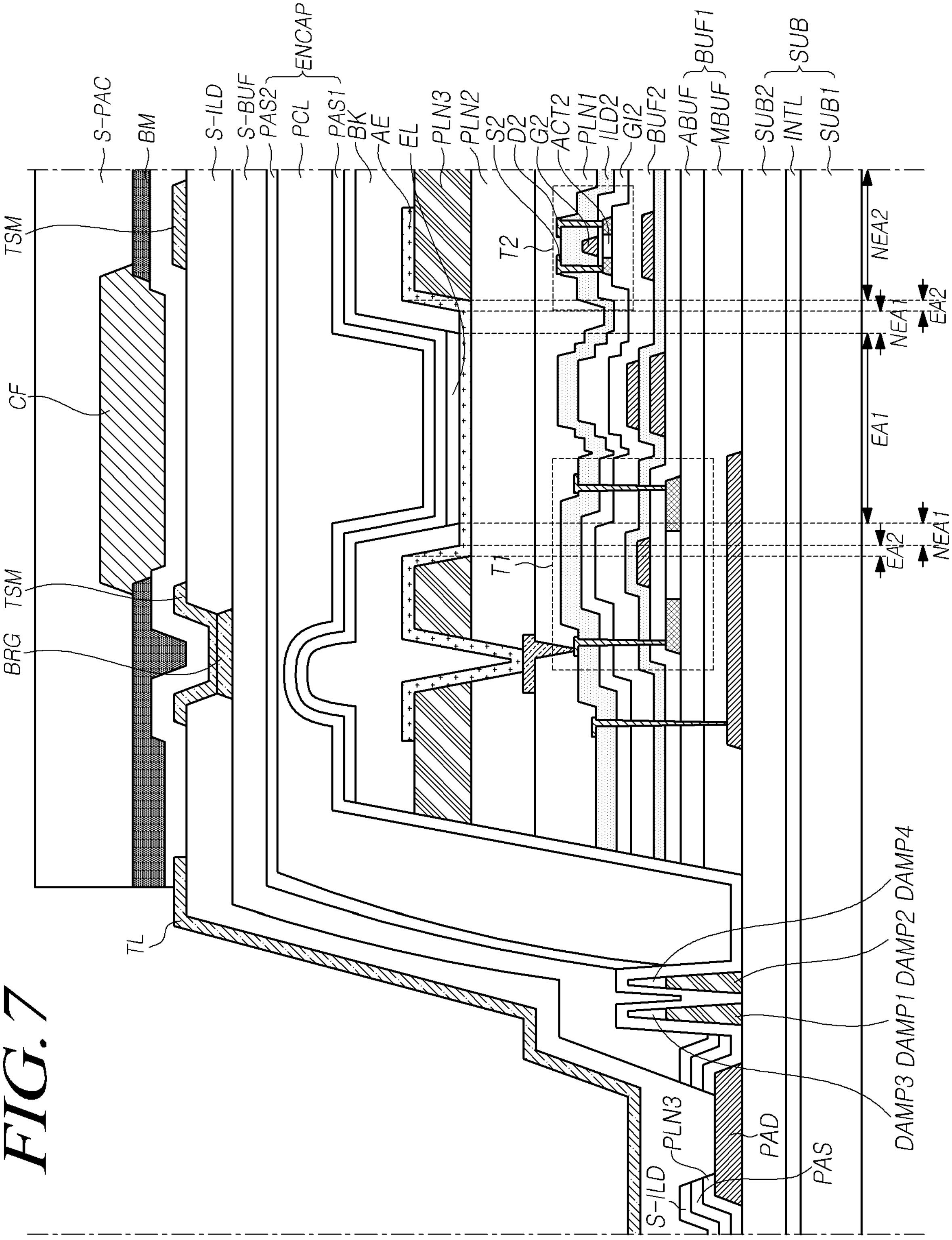

FIGS. 6 and 7 are cross-sectional views illustrating a structure of a display device according to embodiments of the disclosure.

Referring to FIGS. 6 and 7, a display device according to embodiments of the disclosure can have a structure in which a third planarization layer PLN3 disposed on the first and second planarization layers PLN1 and PLN2 has a concave portion 210 in an area overlapping with the first emission area EA1 and the second emission area EA2.

An encapsulation layer ENCAP can be disposed on the light emitting element ED of the display panel. The encapsulation layer ENCAP can be disposed to cover the light emitting elements ED.

Specifically, referring to FIGS. 6 and 7, the display panel according to embodiments of the disclosure can include an encapsulation layer ENCAP formed on the cathode electrode CE (or the first cathode electrode).

The encapsulation layer ENCAP can be a layer that prevents penetration of moisture or oxygen into the light emitting element ED1 disposed under the encapsulation layer ENCAP. In particular, the encapsulation layer ENCAP can prevent penetration of moisture or oxygen into the light emitting layer EL, which can include an organic film. Here, the encapsulation layer ENCAP can be composed of a single film or a multi-film structure.

Referring to FIGS. 6 and 7, the encapsulation layer ENCAP can include a first encapsulation layer PAS1, a second encapsulation layer PCL, and a third encapsulation layer PAS2. The first encapsulation layer PAS1 and the third encapsulation layer PAS2 can be inorganic films, and the second encapsulation layer PCL can be an organic layer.

As the second encapsulation layer PCL is formed of an organic film, the second encapsulation layer PCL can serve as a planarization layer.

Referring to FIGS. 6 and 7, the encapsulation layer ENCAP can include a first encapsulation layer PAS1, a second encapsulation layer PCL, and a third encapsulation layer PAS2.

The first encapsulation layer PAS1 and the third encapsulation layer PAS2 can be inorganic films, and the second encapsulation layer PCL can be an organic film.

Further, the second encapsulation layer PCL and the third encapsulation layer PAS2 can be disposed in a portion of the non-active area N/A, but may not be disposed in the area in which the dam DAM is disposed and the area in which the pad electrode PAD is disposed.

Meanwhile, the display panel 110 according to embodiments of the disclosure can include a touch sensor. In this situation, the display panel 110 according to embodiments of the disclosure can include a touch sensor portion formed on the encapsulation layer ENCAP.

Referring to FIGS. 6 and 7, the touch sensor portion can include touch sensor metals TSM and bridge metals BRG and can further include insulation film components, such as a sensor buffer layer S-BUF, a sensor inter-layer insulation film S-ILD, and a sensor protection layer S-PAS.

The sensor buffer layer S-BUF can be disposed on the encapsulation layer ENCAP. The bridge metals BRG can be disposed on the sensor buffer layer S-BUF. The sensor inter-layer insulation film S-ILD can be disposed on the bridge metals BRG.

The sensor buffer layer S-BUF and the sensor inter-layer insulation film S-ILD can extend to the non-active area N/A as well as the active area A/A of the display panel 110. Each of the sensor buffer layer S-BUF and the sensor inter-layer insulation film S-ILD can be disposed to expose a portion of the upper surface of the pad electrode PAD in the non-active area N/A.

The touch sensor metals TSM can be disposed on the sensor inter-layer insulation film S-ILD. Some of the touch sensor metals TSM can be connected to the corresponding bridge metal BRG through a hole in the sensor inter-layer insulation film S-ILD.

The plurality of touch sensor metals TSM can configure one touch electrode (or one touch electrode line) and can be disposed in a mesh form and electrically connected. Some of the touch sensor metals TSM and some others of the touch sensor metals TSM can be electrically connected through a bridge metal BRG, configuring one touch electrode (or one touch electrode line).

Referring to FIGS. 6 and 7, the touch sensor metals TSM and the bridge metals BRG can be disposed to not overlap with the first and second emission areas EA1 and EA2. For example, the touch sensor metals TSM and the bridge metals BRG can be disposed in areas between the subpixels.

Accordingly, when the touch sensor metals TSM overlap with the first and second emission areas EA1 and EA2, the amount of light emitted from the light emitting element ED to the outside of the display panel 110 can be reduced, and thus the luminance can be reduced. However, in the display panel according to embodiments of the disclosure, since the touch sensor metals TSM do not overlap the first and second emission areas EA1 and EA2, it is possible to provide a touch function while maintaining high luminance characteristics.

Referring to FIGS. 6 and 7, the touch sensor metals TSM do not overlap with the first non-emission area NEA1 surrounding the first emission area EA1.

Even when the first non-emission area NEA1 emits light with a luminance lower than those of the first and second emission areas EA1 and EA2 due to light incident from at least one of the first emission area EA1 and the second emission area EA2, a further decrease in luminance due to the touch sensor metals TSM can be prevented.

Referring to FIGS. 6 and 7, a touch line TL can be disposed on the sensor inter-layer insulation film S-ILD.

The touch line TL can be electrically connected to at least one touch sensor metal TSM.

The touch line TL can extend to the area in which the pad electrode PAD disposed in the non-active area N/A is disposed, and can be electrically connected to the pad electrode PAD.

Referring to FIGS. 6 and 7, a sensor protection layer S-PAS can be disposed on the touch sensor metals TSM and a portion of the touch line TL.

Further, referring to FIG. 7, the display device according to embodiments of the disclosure can include a plurality of color filters CF disposed on the light emitting element ED.

For example, a plurality of color filters CF can be disposed on the touch sensor metals TSM.

Referring to FIG. 7, a black matrix BM can be disposed on the sensor protection layer S-PAS. The black matrix BM can be disposed to not overlap with the first emission area EA1, the second emission area EA2, and the first non-emission area NEA1 formed in one subpixel area, according to an embodiment. In other words, the black matrix BM can be disposed to correspond to an edge of the second non-emission area NEA2. For example, an opening in the black matrix BM can be aligned with an opening in the third planarization layer PLN3, and a size of the opening in the black matrix BM can be greater than or equal to a size of the opening in the third planarization layer PLN3. Also, the black matrix BM can be disposed to correspond to the third planarization layer PLN3, but embodiments are not limited thereto. According to an embodiment, the area of the black matrix BM can be greater than the area of the third planarization layer PLN3. In order to prevent light leakage at the perimeter, an end of the black matrix BM in the non-active area N/A can be disposed to extend further outward than an end of the third planarization layer PLN3, but embodiments are not limited thereto. Also, the black matrix BM can be formed to have a solid black color or a solid opaque color that can fully or at least partially block light, but embodiments are not limited thereto.

The black matrix BM can include an opening corresponding to a plurality of first emission areas EA1, a second emission area EA2, and a first non-emission area NEA1 in the display panel 110. For example, in a top view or the plan view, the black matrix BM can have openings corresponding to the subpixels, in which each opening can include a subpixel that has a first emission areas EA1, a second emission area EA2, and a first non-emission area NEA1 between the first emission area EA1 and the second emission area EA2, in which the black matrix BM does not overlap with the emission areas (e.g., the black matrix BM can have a mesh structure or a lattice configuration). As shown in FIG. 7, the opening in the black matrix BM can be aligned with or correspond to the opening in the third planarization layer PLN3. For example, the black matrix BM can be configured in the form of a sheet with a plurality of holes corresponding to the subpixels. Also, a size of each of the openings in the third planarization layer PLN3 can be smaller than or equal to a size of each openings in the bank BK, and the size of each of the openings in the bank BK can be smaller than a size of each of the openings in the black matrix BM and the size of the openings in the third planarization layer PLN3, but embodiments are not limited thereto.

Further, as illustrated in FIG. 7, a plurality of color filters CF can be disposed on a portion of the black matrix BM and the sensor protection layer S-PAS to be spaced apart from each other. The plurality of color filters CF can include a red color filter, a green color filter, and a blue color filter. The color filter CF can fill the opening in the black matrix BM and can fill a depression in the sensor protection layer S-PAS, but embodiments are not limited thereto. Also, as shown in FIG. 7, the height or thickness of the second planarization layer PLN2 and the third planarization layer PLN3 can be equal or substantially equal to each other, and the height or thickness of the bank BK can be less than the second planarization layer PLN2 and the third planarization layer PLN3 (e.g., BK<PLN2 and BK<PLN3). In this way, the display panel can be made thinner and the path traveled by the emitted light to exit the display panel can be made shorter, which can improve image quality. Also, to improve light extraction, the height or thickness of the third planarization layer PLN3 is greater than the height or thickness of the bank BK, in order to allow the side mirror area of the anode to have sufficient size for reflecting light out of the display panel while also maintaining a thin design due to the thinness of the bank BK (e.g., thinness of the display panel can be optimally balanced with sufficient reflectiveness or light extraction of the anode).

As described above, since the color filter CF is disposed to not overlap with the first emission area EA1, the second emission area EA2, and the first non-emission area NEA, color coordinate characteristics of the display panel can be enhanced.

Referring to FIG. 7, a sensor planarization layer S-PAC can be disposed on the color filter CF and the black matrix BM.

Further, as illustrated in FIG. 7, outer edges of the second planarization layer PLN2, the third planarization layer PLN3 and the bank BK can be flush and aligned with each other and all have a same slope, in an area corresponding to an outer edge or side area of the display panel. In this way, space can be conserved and a narrower bezel can be implemented.

Problems with a display panel according to a comparative example are described with reference to FIG. 8.

Figure 8:
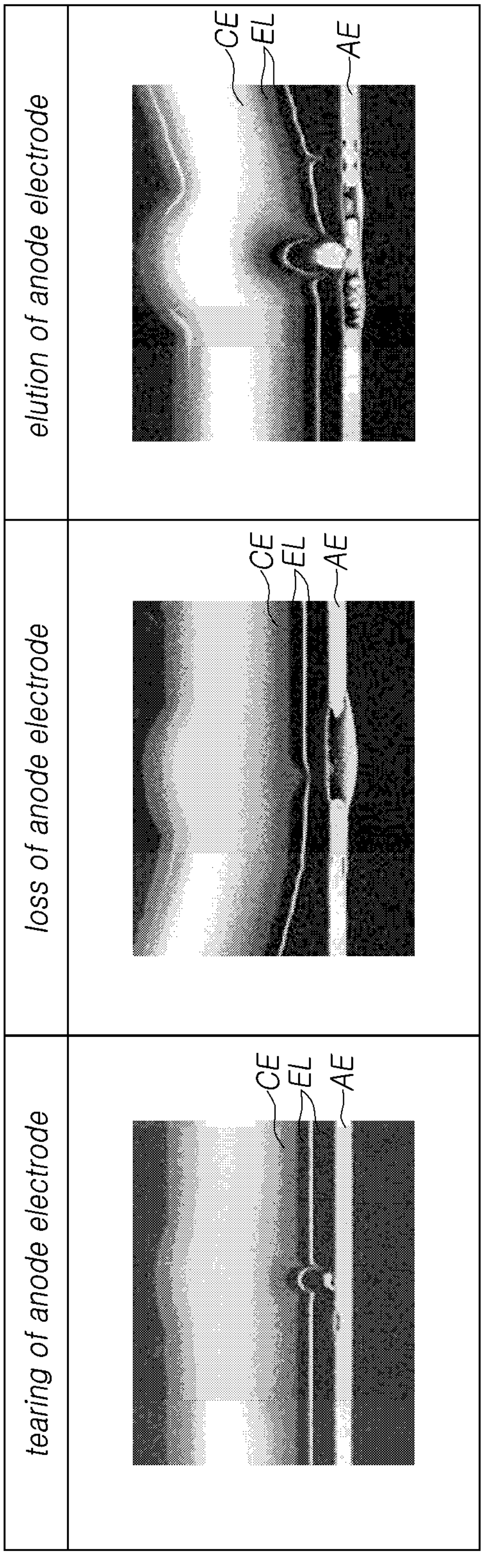
FIG. 8 is a photograph illustrating a situation in which a defect occurs in a display panel of a comparative example using a black bank to enhance reflectance.

FIG. 8 is a photograph illustrating a defect of a light emitting element in an area from which a black bank material has been removed after a process for patterning the black bank material in a display panel using the black bank to enhance reflectance according to a comparative example.

The bank of FIG. 8 can be formed through a process of forming a black bank material on the anode electrode, patterning the bank material through an ashing process, and exposing a portion of the upper surface of the anode electrode. The anode electrode can include silver (Ag) as a reflective material.

In the process of patterning the black bank material, the anode electrode disposed under the black bank material can be damaged, causing a defect in the display panel.

For example, when the black bank material is patterned through an ashing process and a strip process after the ashing process, tearing of the anode electrode AE can occur as illustrated in FIG. 8.

Further, referring to FIG. 8, when a black bank material is patterned through an ashing process and a substrate is cleaned with ozone (03), the anode electrode AE can be partially lost. In this situation, the light emitting layer EL and the cathode electrode CE can be lifted due to the particles of the lost anode electrode AE.

Further, when the black bank material is patterned through an ashing process, a pin hole of the anode electrode AE can be caused, and thus the anode electrode AE component can be eluted through the pin hole. Even in this situation, the light emitting layer EL and the cathode electrode CE can be lifted due to the particles of the lost anode electrode AE.

When tearing, loss, and elution of the anode electrode AE occur, a dark spot or a dead subpixel can arise in the display panel.

However, in the display panel according to embodiments of the disclosure, since a transparent bank is disposed on a portion of the upper surface of the anode electrode, it is possible to prevent damage to the anode electrode AE that can arise if a black bank material is patterned.

Further, since the black third planarization layer PLN3 is disposed under the anode electrode AE, the third planarization layer PLN3 can be formed without damaging the anode electrode AE. In other words, since the third planarization layer PLN3 is formed before the anode electrode AE is formed, damage to the anode electrode AE can be prevented and risks can be avoided. For example, the anode electrode AE, the light emitting layer EL and the cathode electrode CE are separated and isolated from issues corresponding to steps used to form the black third planarization layer PLN3.

In particular, when the anode electrode AE of the display panel according to embodiments of the disclosure has a three-layer structure including a first transparent conductive material layer, a reflective electrode layer disposed on the first transparent conductive material layer, and a second transparent conductive material layer disposed on the reflective electrode layer, the thickness of the first transparent conductive material layer can be enhanced to prevent damage to the reflective electrode layer due to outgassing or fumes generated from the third planarization layer.

If a black bank is positioned on an anode electrode AE having a three-layer structure, a chemical solution used to form the black bank material can penetrate the second transparent conductive material layer, causing damage to the reflective electrode layer. Thus, according to an embodiment, the black third planarization layer PLN3 can be formed before the anode electrode AE, and any risk of damaging the anode electrode AE having a three-layer structure can be avoided.

Arrival at the reflective electrode layer of the chemical solution can be prevented by increasing the thickness of the second transparent conductive material layer. However, since the thickness of the second transparent conductive material layer affects the microcavities of the light emitting element, there is a limitation in increasing the thickness.

On the other hand, since the thickness of the first transparent conductive material layer does not affect the microcavities of the light emitting element, increasing the thickness does not cause any issue. As described above, in the display panel according to embodiments of the disclosure, since the third planarization layer PLN3 is disposed under the anode electrode AE, it is possible to protect the reflective electrode layer from damage by increasing the thickness of the first transparent conductive material layer.

In this situation, in the display panel according to embodiments of the disclosure, the thickness of the first transparent conductive material layer can be larger than the thickness of the second transparent conductive material layer.

The reflectance and reflection visual perception characteristics of a display panel according to embodiments of the disclosure are described with reference to FIGS. 9 and 10.

Figure 9:
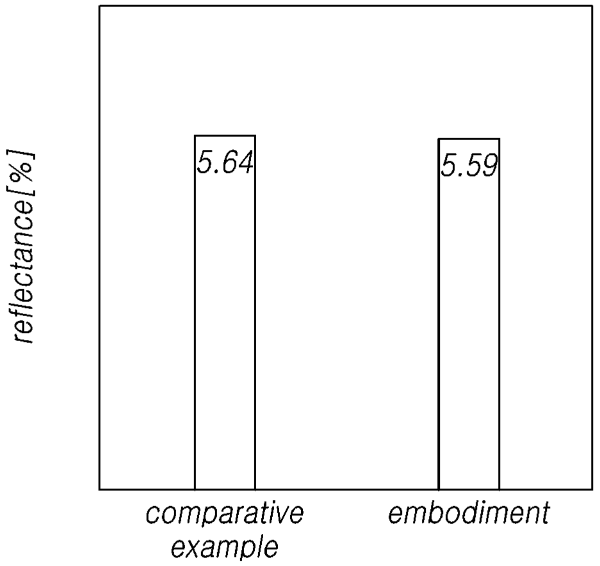
FIG. 9 is a view illustrating the reflectance of a display panel according to an embodiment and a comparative example.
Figure 10:
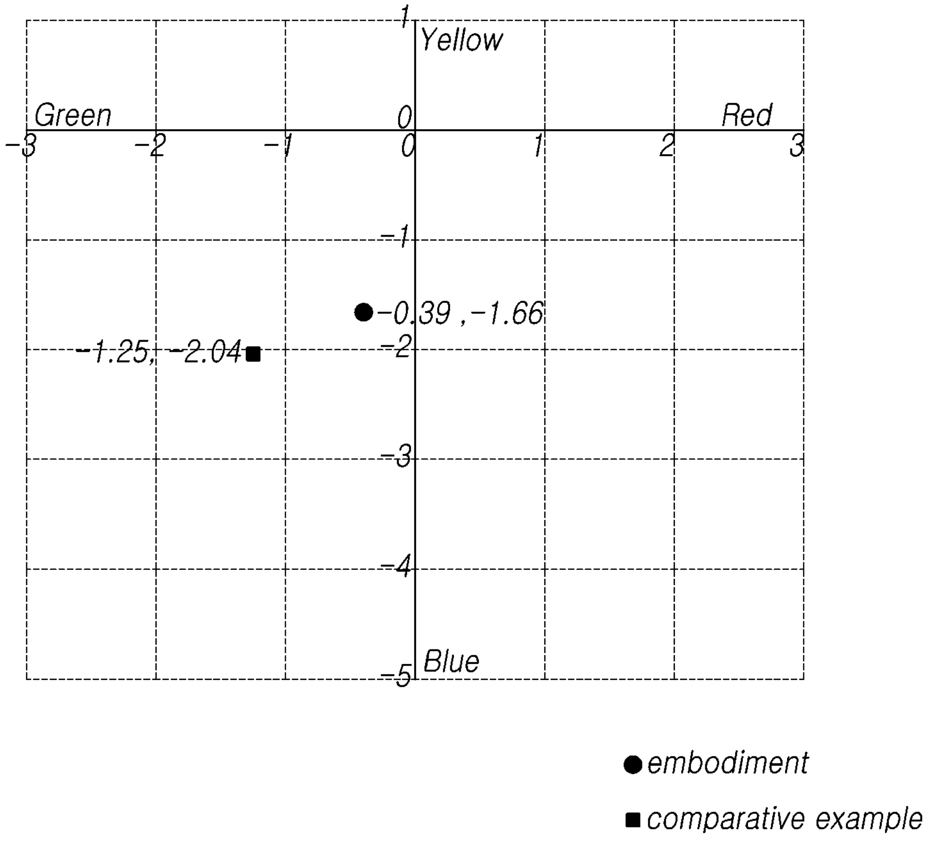
FIG. 10 is a view illustrating the reflection visual perception of a display panel according to an embodiment and a comparative example.

FIG. 9 is a view illustrating the reflectance of a display panel according to an embodiment and a comparative example, and FIG. 10 is a view illustrating the reflection visual perception of a display panel according to an embodiment and a comparative example.

The display panel according to the comparative example of FIGS. 9 and 10 can have a structure in which a transistor is disposed on a substrate, a general transparent planarization layer is disposed on the transistor, an anode electrode is disposed on the planarization layer, a transparent bank is disposed on the anode electrode, and a light emitting layer and a cathode electrode are disposed on the anode electrode.

The display panel according to the embodiment of FIGS. 9 and 10 can have the structure of FIG. 2.

First, referring to FIG. 9, the reflectance of the display panel according to the embodiment can be lower than the reflectance of the display panel according to the comparative example.

Referring to FIG. 10, the reflection visual perception is imbalanced toward green and blue in the display panel according to the comparative example, but it can be seen that the value on the x-axis and the value on the y-axis of the display panel according to the embodiment are much closer to 0 than the value on the x-axis and the value on the y-axis of the display panel according to the comparative example.

In other words, it can be seen that the characteristics of the reflection visual perception of the display panel according to the embodiment are superior to the characteristics of the reflection visual perception of the display panel according to the comparative example.

According to embodiments of the disclosure described above, there can be provided a display panel and a display device capable of enhancing light extraction efficiency while providing superior reflectance and reflection visual perception characteristics as the planarization layer disposed under the anode electrode absorbs light and includes a concave portion corresponding to the emission area.

According to embodiments of the disclosure, there can be provided a display panel and a display device capable of low-power driving through high luminous characteristics as one subpixel includes a plurality of emission areas to emit light in the same color.

According to embodiments of the disclosure, there can be provided a display panel and a display device capable of simplifying the manufacturing process by forming different components through the same process.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A subpixel, comprising:

a transistor disposed on a substrate;

a first planarization layer disposed on the transistor, the first planarization layer including a concave portion that corresponds to an emission area of the subpixel and a first inclined side surface;

a second planarization layer disposed between the transistor and the first planarization layer, the second planarization layer including an additional concave portion having a second inclined side surface and a substantially flat bottom surface;

an anode electrode disposed in the concave portion of the first planarization layer and in the additional concave portion of the second planarization layer;

a light emitting layer disposed on the anode electrode; and a bank disposed on the anode electrode, wherein a portion of the bank is disposed in the concave portion of the first planarization layer in an area between a portion of the light emitting layer and a portion of the anode electrode that extends along the first inclined side surface of the first planarization layer, wherein a slope of the first inclined side surface of the first planarization layer is steeper than a slope of the second inclined side surface of the second planarization layer, and wherein the anode electrode continuously extends along the first inclined side surface of the first planarization layer and the substantially flat bottom surface of the second planarization layer, and overlaps with the second inclined side surface of the second planarization layer.

2. The subpixel of claim 1, wherein the first planarization layer is configured to block or absorb light.

3. The subpixel of claim 2, wherein the first planarization layer includes a black material.

4. The subpixel of claim 1, wherein a lowermost inclined portion of the light emitting layer is spaced apart from the anode electrode by a portion of the bank that is disposed between the lowermost inclined portion of the light emitting layer and the anode electrode.

5. The subpixel of claim 1, wherein the bank includes a transparent material configured to allow light emitted from the light emitting layer to pass through the bank.

6. The subpixel of claim 1, wherein the concave portion of the first planarization layer is a hole that extends all the way through the first planarization layer.

7. The subpixel of claim 1, wherein the emission area of the subpixel includes a first emission area, a second emission area, and a first non-emission area between the first emission area and the second emission area.

8. The subpixel of claim 7, wherein a portion of the anode electrode that extends along the substantially flat bottom surface of the second planarization layer corresponds to the first emission area, wherein an area corresponding to the portion of the bank that is disposed in the concave portion of the first planarization layer corresponds to the first non-emission area, and wherein a portion of the anode electrode disposed on the first inclined side surface of the first planarization layer corresponds to the second emission area.

9. The subpixel of claim 1, wherein a transmittance of the bank is lower than a transmittance of the first planarization layer and a transmittance of the second planarization layer.

10. The subpixel of claim 1, further comprising a contact hole in the first planarization layer, wherein the anode electrode is electrically connected to the transistor via the contact hole.

11. The subpixel of claim 10, further comprising a spacer disposed on the bank and overlapping with the contact hole in the first planarization layer.

12. The subpixel of claim 1, wherein the anode electrode includes:

a first transparent conductive material layer;

a second transparent conductive material layer; and a reflective electrode layer disposed between the first transparent conductive material layer and the second transparent conductive material layer.

13. The subpixel of claim 12, wherein a thickness of the first transparent conductive material layer is greater than a thickness of the second transparent conductive material layer.

14. A display device, comprising:

a display panel configured to display an image, wherein the display panel includes the subpixel of claim 1.

15. The subpixel of claim 1, wherein the first planarization layer includes a light-absorbing black material, the bank includes a transparent material, and the anode electrode includes a reflective material.

16. The subpixel of claim 1, further comprising a cathode electrode disposed on the light emitting layer, wherein the cathode electrode continuously extends over the substantially flat bottom surface of the second planarization layer, the first inclined side surface of the first planarization layer, and a top surface of the bank.

17. The subpixel of claim 1, wherein the anode electrode includes an uppermost edge disposed on an upper surface of the first planarization layer and an inclined portion disposed on first inclined side surface of the first planarization layer, and wherein the bank covers the uppermost edge and the inclined portion of the anode electrode and physically separates the anode electrode from the light emitting layer.

18. A display device, comprising:

a plurality of subpixels disposed on a substrate, each of the plurality of subpixels including:

a first planarization layer including a concave portion having a first inclined side surface;

a second planarization layer disposed between the substrate and the first planarization layer, the second planarization layer including an additional concave portion having a second inclined side surface and a substantially flat bottom surface; and an anode electrode disposed in the concave portion of the first planarization layer and the additional concave portion of the second planarization layer; and a black matrix including a plurality of openings corresponding to the plurality of subpixels, wherein each of the plurality of subpixels includes a first emission area, a second emission area, and a first non-emission area between the first emission area and the second emission area, wherein the first emission area, the first non-emission area and the second emission area of a corresponding subpixel among the plurality of subpixels is located inside of an opening among the plurality of openings in the black matrix, wherein a slope of the first inclined side surface of the first planarization layer is steeper than a slope of the second inclined side surface of the second planarization layer, wherein the first emission area corresponds to a portion of the anode electrode disposed on the substantially flat bottom surface of the second planarization layer, and wherein the second emission area corresponds to a portion of the anode electrode disposed on the first inclined side surface of the first planarization layer.

19. The display device of claim 18, further comprising:

a bank including a plurality of openings for the plurality of subpixels, wherein each of the plurality of openings in the bank corresponds to the first emission area of one of the plurality of subpixels.

20. The display device of claim 19, wherein an area of the black matrix is greater than an area of the bank.

21. The display device of claim 19, wherein a size of each of the plurality of openings in the bank is smaller than a size of each of the plurality of openings in the black matrix.

22. The display device of claim 18, wherein the first non-emission area surrounds the first emission area, and the second emission area surrounds the first non-emission area, and wherein an outer edge of the second emission area corresponds to an edge of one of the plurality of openings in the black matrix.

23. The display device of claim 22, wherein the first emission area and the first non-emission area of each of the plurality of subpixels are included in the concave portion of the first planarization layer.

24. The display device of claim 23, further comprising:

a bank including a plurality of openings for the plurality of subpixels, wherein each of the plurality of openings in the bank corresponds to the first emission area of one of the plurality of subpixels, and wherein a size of the additional concave portion of the second planarization layer is smaller than a size of each of the plurality of openings in the bank, and the size of each of the plurality of openings in the bank is smaller than a size of each of the plurality of openings in the black matrix.

25. The display device of claim 23, further comprising:

a dam disposed in a non-emission area of the substrate, wherein the dam and the first planarization layer include a same black material.

* * * * *